United States Patent

Davis et al.

Patent Number: 6,133,632
Date of Patent: *Oct. 17, 2000

[54] COMMONLY HOUSED DIVERSE SEMICONDUCTOR DIE

[75] Inventors: Christopher Davis, Thousand Oaks; Chuan Cheah; Daniel M. Kinzer, both of El Segundo, all of Calif.

[73] Assignee: International Rectifier Corp., El Segundo, Calif.

[*] Notice: This patent is subject to a terminal disclaimer.

[21] Appl. No.: 09/161,790

[22] Filed: Sep. 28, 1998

Related U.S. Application Data

[63] Continuation of application No. 08/816,829, Mar. 18, 1997, Pat. No. 5,814,884
[60] Provisional application No. 60/029,483, Oct. 4, 1996.

[51] Int. Cl.[7] ............................. H01L 23/34; H01L 23/48; H01L 23/52; H01L 29/40; H01L 27/088
[52] U.S. Cl. ............................. 257/723; 257/773; 257/901
[58] Field of Search .................... 257/109, 497, 257/685, 723, 773, 901, 904

[56] References Cited

U.S. PATENT DOCUMENTS

| | | | |
|---|---|---|---|
| 4,137,546 | 1/1979 | Frusco | 257/670 |
| 4,641,418 | 2/1987 | Meddles | 264/272.17 |
| 5,049,973 | 9/1991 | Satriano et al. | 257/670 |
| 5,083,189 | 1/1992 | Savaya | 257/685 |
| 5,084,753 | 1/1992 | Goida et al. | 257/685 |
| 5,200,640 | 4/1993 | Scheftic et al. | 257/693 |
| 5,309,020 | 5/1994 | Murasawa et al. | 257/685 |
| 5,313,095 | 5/1994 | Tagawa et al. | 257/672 |
| 5,332,921 | 7/1994 | Dousen et al. | 257/685 |
| 5,451,814 | 9/1995 | Yoshimizu | 257/685 |
| 5,479,050 | 12/1995 | Pritchard et al. | 257/670 |
| 5,495,125 | 2/1996 | Uemura | 257/664 |
| 5,544,038 | 8/1996 | Fisher et al. | 363/147 |
| 5,760,467 | 6/1998 | Itihasi | 257/676 |
| 5,994,768 | 11/1999 | Fogelson | 257/666 |

FOREIGN PATENT DOCUMENTS

| | | |
|---|---|---|
| 8913465 | 4/1999 | Germany . |
| 5243459 | 9/1993 | Japan . |
| 7130927 | 5/1995 | Japan . |
| 9627209 | 9/1996 | WIPO . |

OTHER PUBLICATIONS

"Electronic Engineering", Dec. 1991, Yehya Kasem and Leo Feinstein, *High Performance Power Package for Power IC Devices, Part 1*, pp. 35–43.

*Primary Examiner*—David Hardy
*Assistant Examiner*—Allan R. Wilson
*Attorney, Agent, or Firm*—Ostrolenk, Faber, Gerb & Soffen, LLP

[57] ABSTRACT

A MOSFET die and a Schottky diode die are mounted on a common lead frame pad and their drain and cathode, respectively, are connected together at the pad. The pad has a plurality of pins extending from one side thereof. The lead frame has insulated pins on its opposite side which are connected to the FET source, the FET gate and the Schottky diode anode respectively by wire bonds. The lead frame and die are molded in an insulated housing and the lead frame pins are bent downwardly to define a surface-mount package.

35 Claims, 5 Drawing Sheets

COMMONLY HOUSED DIVERSE SEMICONDUCTOR DIE

RELATED APPLICATIONS

This application is a continuation of application Ser. No. 08/816,829, filed Mar. 18, 1997, now U.S. Pat. No. 5,814,884, and claims the priority of Provisional Application Ser. No. 60/029,483 filed Oct. 4, 1996.

FIELD OF THE INVENTION

This invention relates to semiconductor devices, and more specifically relates to a novel device in which a plurality of die, which may be of diverse size and of diverse junction pattern, are fixed to a common lead frame and within a common package or housing.

BACKGROUND OF THE INVENTION

Numerous electrical circuits, for example, DC to DC converters, synchronous converters, and the like require a number of semiconductor components such as MOSFETs and Schottky diodes. These components are frequently used in portable electronics apparatus and are commonly separately housed and must be individually mounted on a support board. The separately housed parts take up board space. Further, each part generates heat and, if near other components, such as microprocessors, can interfere with the operation of the microprocessor.

It would be desirable to reduce the board space required by plural semiconductor devices and to reduce part count and assembly costs in power converters and other power subsystems for high-density applications.

BRIEF DESCRIPTION OF THE INVENTION

In accordance with the invention, two or more diverse semiconductor die are laterally spaced and mounted on a common lead frame with a first one of each of their power terminals electrically connected to the lead frame. The main lead frame body then has a first set of externally available pins which are used to make connection to the first one of the power terminals of each of the diverse die. The die are also provided with second power terminals at the tops of the die, and these are connected to respective external pins of the lead frame which are isolated from one another and from the first set of external pins. One or more of the die may also contain a control terminal, such as the gate electrode of a MOSFET die, and a further and isolated pin of the lead frame is connected to this gate terminal.

The lead frame and die are then over-molded with a suitable insulation compound housing, with the various pins extending in-line and beyond the edge surfaces of the housing and available for external connection.

The housing may take the form of a surface-mounted housing with a very small "footprint". By way of example, a MOSFET die and a Schottky diode die may be contained within and may have their drain electrodes and cathode electrodes respectively soldered to a common conduction lead frame pad to be interconnected within the housing. The FET source and gate terminals on top of the die are wire bonded to insulated lead frame pins and the top Schottky diode anode is also connected to an isolated pin so that any desired external connection can be made to the package.

While any package style can be used, the novel invention has been carried out with an SO-8 style small outline package.

The novel package of the invention can improve efficiency of a DC to DC converter by reducing power drain on batteries, leading to a longer life. For desk top systems, the device reduces power dissipation and heat generation near temperature-sensitive parts such as microprocessors. The device also provides substantial savings in board space while reducing component count and assembly costs.

For example, the use of a copackaged FET Type IRF7422D2 (a (−20) volt 90 mohm P channel FET) and a Schottky diode (30 volt, 1 ampere) in a buck converter circuit provided a 60% saving in board space and assembly cost.

Other features and advantages of the present invention will become apparent from the following description of the invention which refers to the accompanying drawings.

DETAILED DESCRIPTION OF THE INVENTION

Figure 1:
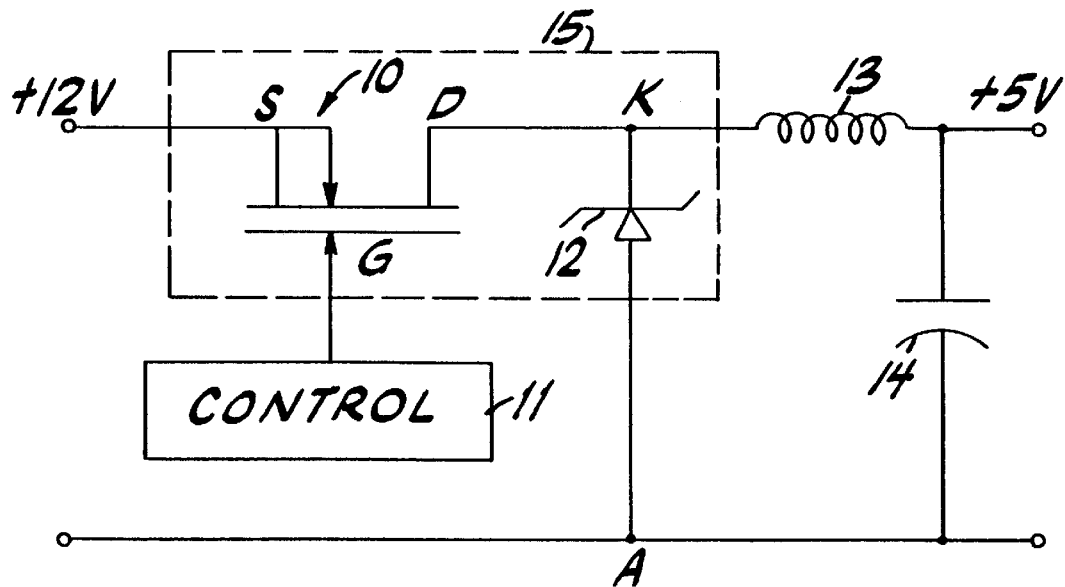
FIG. 1 is a circuit diagram of a known buck converter circuit using a P channel MOSFET.

Referring first to FIG. 1, there is shown a conventional buck converter circuit, sometimes known as a step down converter, which is commonly used to reduce the voltage to integrated circuits and processors on the circuit board of a portable electronic device or the like. For example, the circuit might be used to reduce an input voltage of 12 volts DC to 5 volts DC (or 3.3 volts DC in some cases) to drive an integrated circuit or other load (not shown).

The circuit of FIG. 1 is well known and uses a P channel MOSFET 10 for the switching function under the control of a suitable control circuit 11 connected to the FET gate G. FET 10 may be a 20 v, 90 m-ohm die available from the International Rectifier Corporation. A Schottky diode 12 which may be a 30 volt, 1 ampere die has its cathode connected to the drain D of FET 10 and is used to perform output current recirculation into inductor 13 and capacitor 14. As will be later shown, and in accordance with the invention, FET 10 and Schottky diode 12 are provided in die form and are mounted on a common lead frame of a single package shown by dotted line block 15. This novel combination produces a 60% space saving on the support board of the device and reduces assembly cost.

It will be apparent that the invention can be employed in many other circuit configurations. For example, FIG. 2 shows a synchronous buck converter circuit using an N channel MOSFET 20 as the switching device, an N channel MOSFET 21, and a Schottky diode 22 in parallel for synchronous rectification.

In accordance with the invention, FET 21 and Schottky diode 22 may be die which are copackaged within a common housing, as shown by dotted block 23. This circuit is useful to avoid losses found in the "lossy" forward voltage drop of the Schottky diode 12 of FIG. 1. It also eliminates the effects of the inherent body diode of the vertical conduction FET 21 from the circuit since the Schottky diode 22 handles the reverse current flow seen by the synchronous rectifier during the "wait" state of controller 24.

Figure 2:
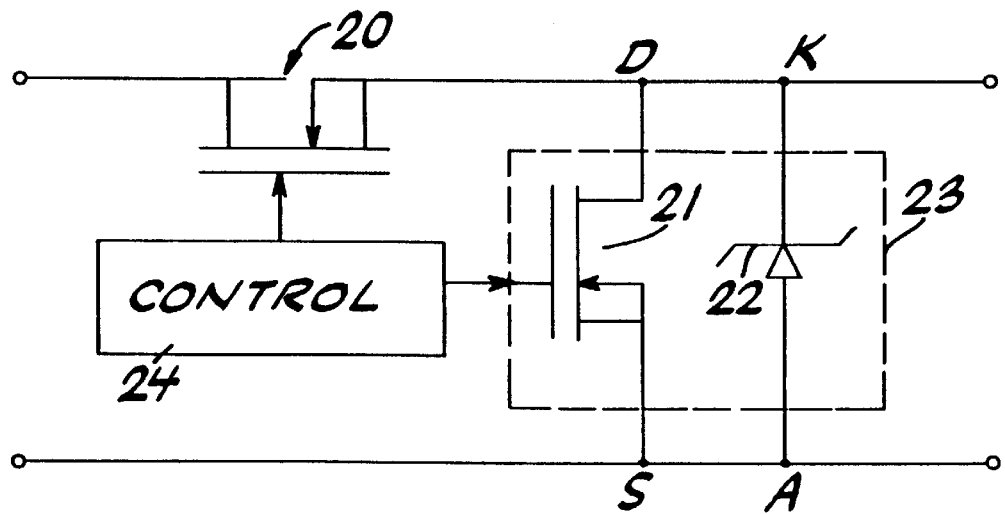
FIG. 2 is a circuit diagram of a buck converter circuit employing an N channel MOSFET and a parallel Schottky diode.

FET 21 of FIG. 2 may be a 30 v, 35 m-ohm die available from the International Rectifier Corporation.

Figure 3:
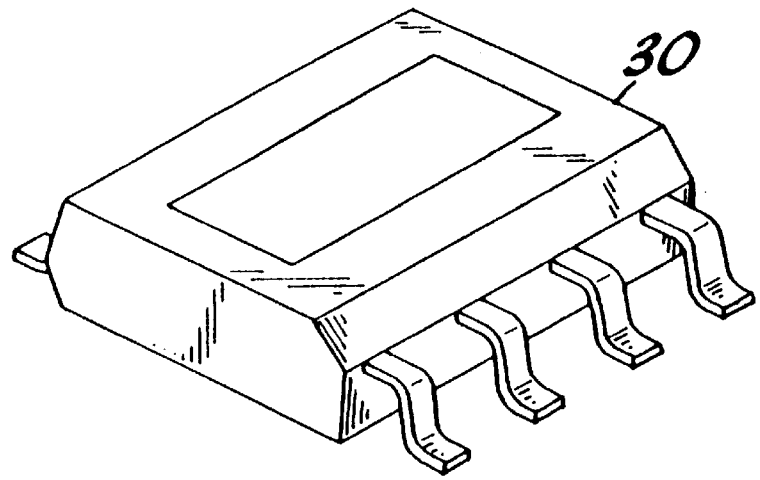
FIG. 3 is a perspective diagram of an SO-8 style package which can be used to house both the MOSFET die and Schottky die of FIGS. 1 and 2 in accordance with an embodiment of the invention.
Figure 4:
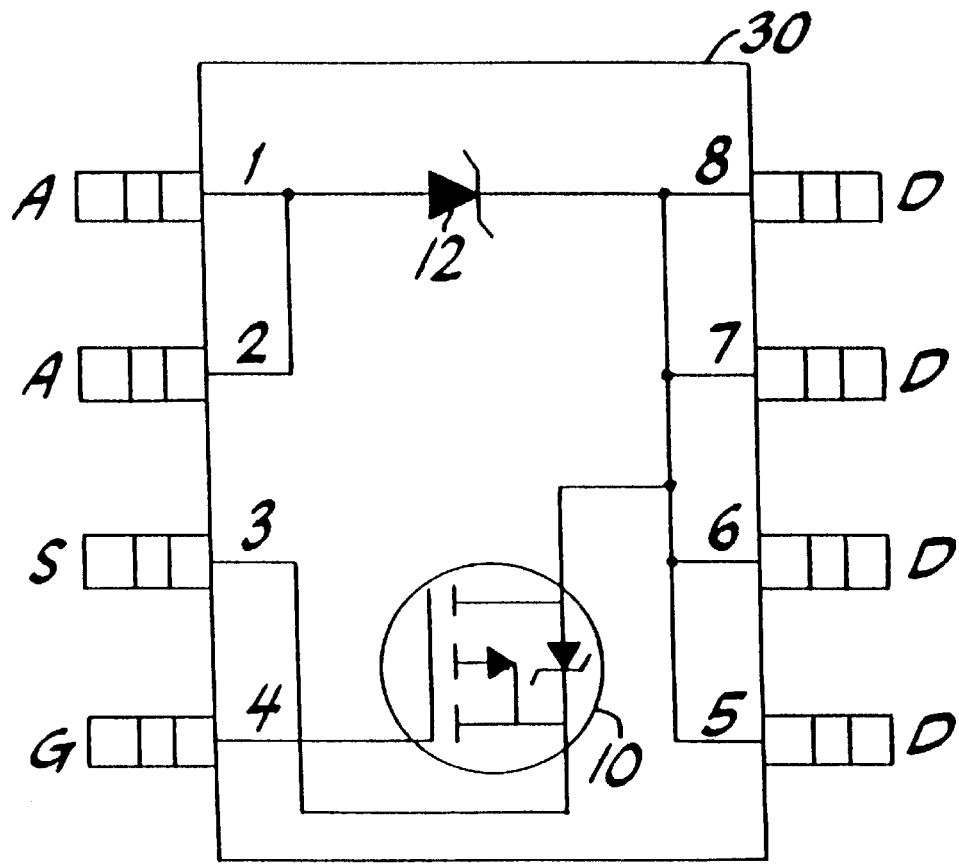
FIG. 4 is a schematic top view of the package of FIG. 3 with the die of the circuit of FIG. 1 copackaged on a common lead frame.

Housings 15 and 23 may take the form of a known housing Type SO-8, shown in FIGS. 3 and 4. Thus, FIG. 3 shows an SO-8 surface mount housing with eight in-line pins 1 to 8 (FIG. 4) which extend from a plastic insulation housing 30. As seen in FIG. 4, the FET die 10 and Schottky diode 12 are internally mounted on a common lead frame, as will be later described and are interconnected to enable their external connection as in FIG. 1 or 2 (with an appropriate FET die 10 or 21) or in other circuit configurations.

In FIG. 4, the drain of FET 10 and cathode of Schottky diode 12 are connected to one another and to pins 5 to 8 of a common lead frame section as will be later described. The source and gate of FET 10 are connected by wire bonds to isolated pins 3 and 4, respectively, and the anode of Schottky diode 12 is connected by wire bonds to isolated pins 1 and 2.

Figure 5:
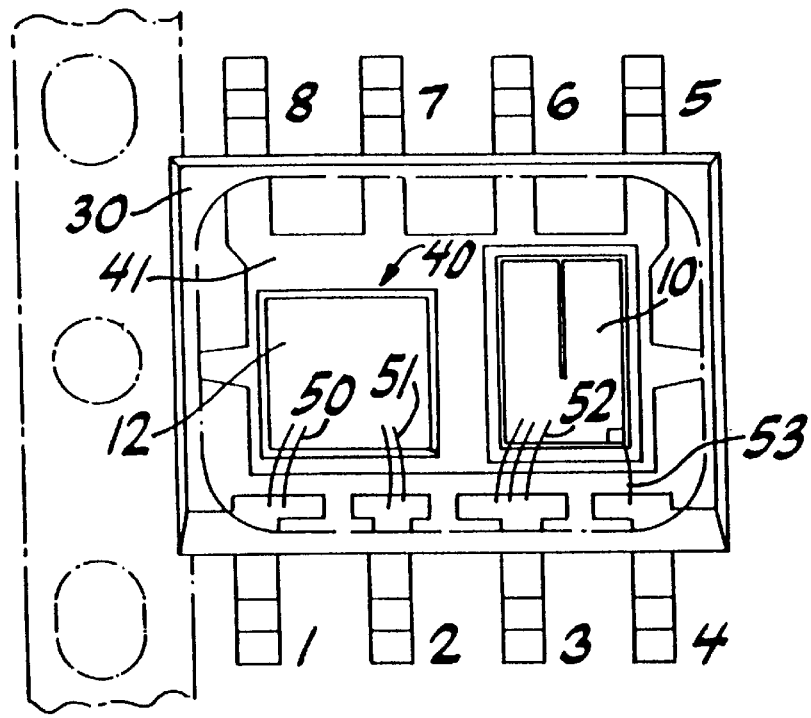
FIG. 5 shows a top view of the lead frame of the package of FIGS. 3 and 4 with the MOSFET die and Schottky diode die fastened to the lead frame.
Figure 6:
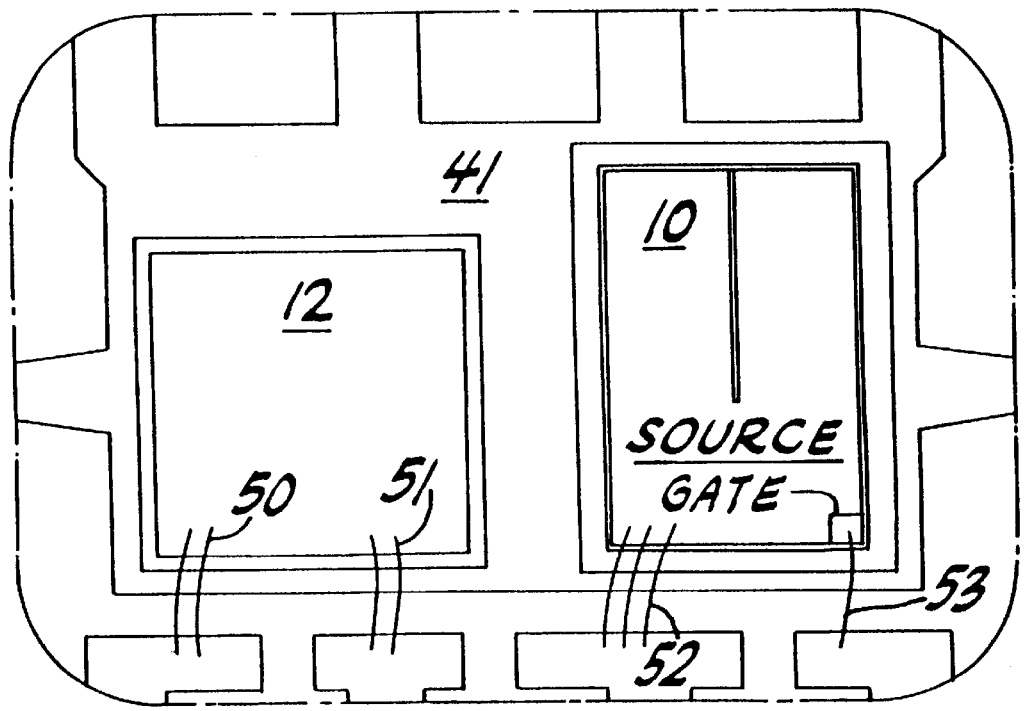
FIG. 6 is an enlarged view of the portion of FIG. 5 which is within the dashed line in FIG. 5.

FIGS. 5 and 6 show the lead frame and FET 10 and Schottky 12 die in more detail. Thus, a lead frame 40 is provided which contains a main pad body 41 from which pins 5 to 8 integrally extend. The main pad body 41 is larger than the main pad body of a conventional lead frame so that both the FET die 60 and the Schottky diode 12 may be mounted to it. According to a novel aspect of the invention, the walls of plastic insulation housing 30 are thinner than a conventional housing to accommodate the larger main pad body without significantly reducing resistance to moisture.

The lead frame also contains pins 1 to 4 and respective bond pad extensions which are within molded housing 30. These are originally integral with the lead frame body 40 (during molding), but are shown in their severed condition which isolates pins 1 to 4 from one another and from main pad 41. Typically, pins 1 to 4 are coplanar with each other and with the main bond pad 41.

Lead frame 40 is a conductive frame and may have a conventional lead frame solder finish. The bottom cathode surface of diode 12 and the bottom drain surface of FET 10 are connected to pad 41 as by a conductive epoxy die attach compound and are thus connected to pins 5 to 8. Alternatively, the cathode surface of diode 12 and the drain surface of FET 10 are soldered to pad 41 or are connected to the pad using a conductive glass containing silver particles.

The top anode electrode of Schottky diode 12 is wire bonded by gold bonding wires 50 and 51 to pins 1 and 2, respectively (before molding), while the source electrode and gate electrode of die 10 are bonded by gold wires 52 and 53 to the internal bonding extensions of pins 3 and 4, respectively, also before molding the housing 30. Alternatively, aluminum bonding wires are used. The internal bonding extension of the pins are typically silver or gold plated. The bonding wires are generally bonded to the die surface and to the internal bonding extensions using thermosonic ball bonding, as is known in the art, though other processes may be used.

Thereafter, the molded housing, which may be a mold compound such as NITTO MP7400, is formed in a conventional molding operation. However, other types of housings, such as a ceramic housing, a hermetic housing or an injection molded metal housing, may be used.

It should be noted that other package styles could be used, but the copackaging in a surface-mount package conserves considerable board space. The resulting device can be soldered down to a printed circuit board using conventional mass production soldering techniques.

Figure 7:
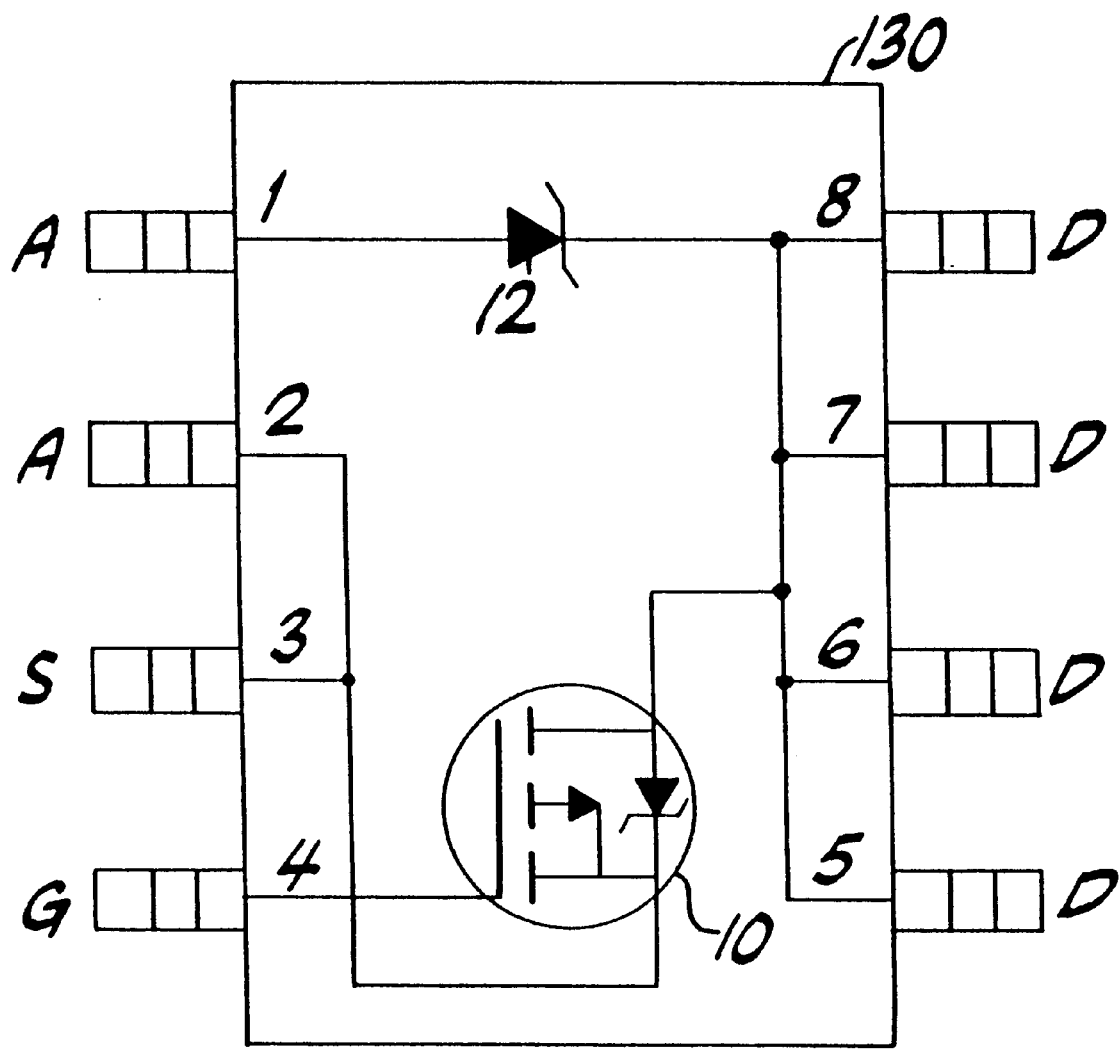
FIG. 7 is a schematic top view of an alternative embodiment of the package of FIG. 3 with the die of the circuit of FIG. 1 copackaged on a common lead frame.
Figure 8:
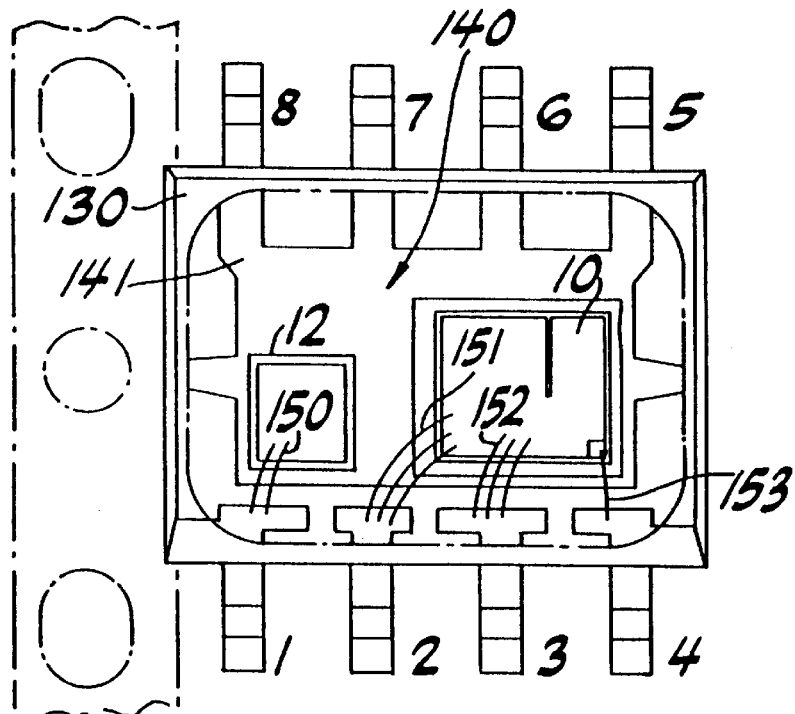
FIG. 8 shows a top view of the lead frame of the package of FIG. 7 with the MOSFET die and the Schottky diode die fastened to the lead frame.

FIGS. 7 and 8 show an alternative embodiment of the invention in which the source of FET 10 is connected by wire bonds 151 and 152 to isolated pins 2 and 3, the gate of FET 10 is connected by wire bonds 153 to isolated pin 4, and the anode of Schottky diode 12 is connected by wire bonds 150 to isolated pin 1. The drain of FET 10 and the cathode of Schottky diode 12 are connected to one another and to pins 5 to 8 of a common lead frame section in the manner described above.

Figure 9:
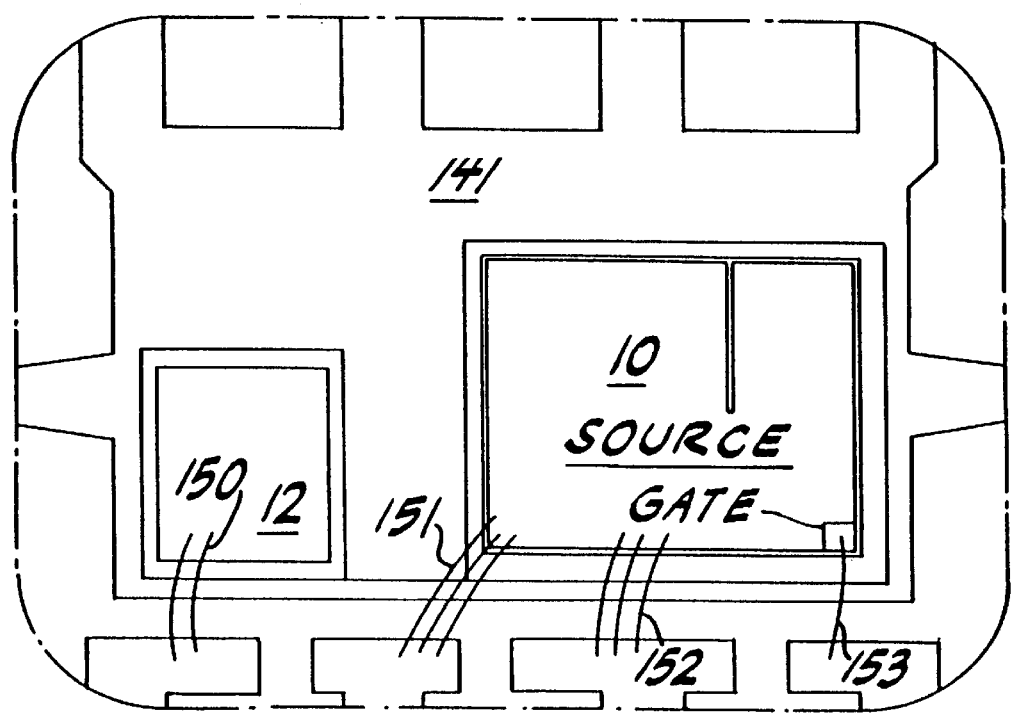
FIG. 9 is an enlarged view of the portion of FIG. 8 which is within the dashed line in FIG. 8.

FIGS. 8 and 9 show the lead frame of this embodiment and the FET 10 and the Schottky diode 12 in greater detail. The lead frame 140 is similar to the lead frame 40 described above and includes a similar main pad body 141. The bottom cathode surface of Schottky diode 12 and the bottom drain surface of FET 10 are connected to pad 141 in a similar manner to that described above, and the top anode electrode of Schottky diode 12 and the source and gate electrodes of FET die 10 are similarly bonded to the internal bonding extensions of the pins as described above. Similarly, the housing 130 is formed in the manner described above.

Although the present invention has been described in relation to particular embodiments thereof, many other variations and modifications and other uses will become apparent to those skilled in the art. It is preferred, therefore, that the present invention be limited not only by the specific disclosure herein, by only by the appended claims.

What is claimed is:

1. A semiconductor device comprising, in combination,
   a first semiconductor die having opposing surfaces which contain respective electrodes,
   a second semiconductor die having opposing surfaces which contain respective electrodes,
   a thin conductive lead frame having
      a common main pad area having a first plurality of parallel pins integral with and extending from one edge thereof, and
      a second plurality of pins separated from said common main pad area;
   said second plurality of pins being disposed along an edge of said common main pad area opposite to the side thereof containing said first plurality of pins at least two of said second plurality of pins being electrically connected together;
   one of said opposing surfaces of each of said first and second semiconductor die being disposed atop and in electrical contact with said common main pad area;
   the opposite ones of said opposing surfaces of said first and second die being in electrical contact with at least one of said second plurality of pins; and
   a molded housing for encapsulating said lead frame and said first and second die;

said first and second pins extending beyond the boundary of said molded housing and available for external connection.

2. The device of claim 1, wherein said first die is a MOSFET die having a source, drain and gate electrode and wherein the surface of said die in contact with said main pad area is the said drain electrode; said source and gate electrodes being electrically connected to at least one respective one of said second plurality of pins.

3. The device of claim 1 wherein said first and second pluralities of pins are downwardly bent along the side edges of said housing to define a surface-mount device.

4. The device of claim 1 wherein said first and second plurality of pins are in line.

5. The device of claim 2 wherein said second die is a Schottky diode die; said opposite surface of said second die comprising the cathode electrode of said Schottky diode, whereby said cathode electrode of said Schottky diode is permanently connected to said drain electrode of said MOSFET and to said first plurality of pins; the opposite surface of said Schottky diode die comprising its anode electrode.

6. The device of claim 5 wherein said anode electrode of said Schottky diode die is connected to at least two of said second plurality of pins.

7. The device of claim 5 wherein said first and second pins are downwardly bent along the side edges of said housing to define a surface-mount device.

8. The device of claim 6 wherein said first and second pluralities of pins are downwardly bent along the side edges of said housing to define a surface-mount device.

9. The device of claim 5 wherein said first and second plurality of pins are in line.

10. The device of claim 6 wherein said first and second plurality of pins are in line.

11. The device of claim 7 wherein said first and second plurality of pins are in line.

12. The device of claim 5 wherein each of said second plurality of pins has an enlarged bonding pad area which are coplanar with one another and with said main pad area.

13. The device of claim 6 wherein each of said second plurality of pins has an enlarged bonding pad area which are coplanar with one another and with said main pad area.

14. The device of claim 7 wherein each of said second plurality of pins has an enlarged bonding pad area which are coplanar with one another and with said main pad area.

15. The device of claim 9 wherein each of said second plurality of pins has an enlarged bonding pad area which are coplanar with one another and with said main pad area.

16. A surface-mount package which contains a MOSFET die and a Schottky diode die; said surface-mount package having a lead frame which has a common main pad section having a first plurality of pins integral with said common main pad section extending through one edge of said housing and a second plurality of coplanar pins extending through an edge of said die opposite to said one edge at least two of said second plurality of coplanar pins being electrically connected together; said MOSFET die having a drain electrode on one surface and a source electrode and gate electrode on an opposite surface; said Schottky diode containing a cathode electrode on one surface and an anode electrode on an opposite surface; said drain electrode and said cathode electrode being fixed in surface-to-surface contact with said common main pad section of said lead frame at laterally displaced locations; said anode electrode, said source electrode and said gate electrode being in electrical contact with at least one of said second plurality of pins within said housing.

17. The device of claim 16 wherein said first and second pluralities of pins consist of four pins, each of which is in line.

18. The device of claim 17 wherein said anode electrode is connected to two adjacent pins of said second plurality of pins.

19. A semiconductor device comprising:

a lead frame having a first plurality of leads and a common die pad, said first plurality of leads being integral with and extending from one edge of said common die pad;

a second plurality of leads spaced from and disposed along a second edge of said common die pad which is opposite to said first edge, at least two of said second plurality of leads being electrically connected together;

a first semiconductor chip having a bottom surface that is secured to said common die pad and comprising a MOSFET having a source terminal, a drain terminal and a gate terminal;

a second semiconductor chip having a bottom surface that is secured to said common die pad and comprising a Schottky diode having an anode terminal and a cathode terminal;

wherein each of said source terminal, said drain terminal, said gate terminal, said anode terminal and said cathode terminal are electrically coupled to at least one of said first and second plurality of leads; and a housing surrounding said first and second semiconductor devices, said common die pad and a respective portion of each of said first and second plurality of leads.

20. The device of claim 19 wherein said plurality of leads comprises eight leads.

21. The device of claim 19 wherein said source and gate terminals of said first semiconductor chip and said anode terminal of said second semiconductor chip are each electrically coupled to at least one of said second plurality of leads.

22. The device of claim 19 wherein said drain terminal of said MOSFET is formed on the bottom surface of said first semiconductor chip and is conductively bonded to said die pad.

23. The device of claim 22 wherein said cathode terminal of said Schottky diode is formed on the bottom surface of said second semiconductor device and is conductively bonded to said die pad so that said drain of said MOSFET and said cathode of said Schottky diode are electrically coupled to at least one common lead of said first plurality of leads.

24. The device of claim 22 wherein said drain terminal is soldered to said die pad.

25. The device of claim 22 wherein said drain terminal is conductively bonded to said die pad using a conductive epoxy.

26. The device of claim 19 wherein said cathode terminal of said Schottky diode is formed on the bottom surface of said second semiconductor chip and is conductively bonded to said die pad.

27. The device of claim 26 wherein said cathode terminal is soldered to said die pad.

28. The device of claim 26 wherein said cathode is conductively bonded to said die pad using a conductive epoxy.

29. The device of claim 19 wherein said source terminal of said MOSFET is formed on a top surface of said MOSFET and is electrically coupled by way of at least a wire bond to at least one of said second plurality of leads.

30. The device of claim 19 wherein said gate terminal of said MOSFET is formed on a top surface of said MOSFET and is wire bonded to at least one of said plurality of leads.

31. The device of claim 19 wherein said source terminal of said MOSFET is electrically coupled to at least two of said second plurality of leads.

32. The device of claim 19 wherein said anode terminal of said Schottky diode is formed on a top surface of said Schottky diode and is electrically coupled by way of at least a wire bond to at least one of said plurality of leads.

33. The device of claim 19 wherein said anode terminal of said Schottky diode is electrically coupled to at least two of said second plurality of leads.

34. The device of claim 19 wherein said housing is a plastic transfer mold compound.

35. The device of claim 34 wherein said plastic transfer mold compound is molded around said first and second semiconductor chips, said die pad and said respective portion of said plurality of leads.

* * * * *